(12) United States Patent
Jang et al.

(10) Patent No.: US 8,008,163 B2
(45) Date of Patent: Aug. 30, 2011

(54) METHOD OF FABRICATING SEMICONDUCTOR DEVICE

(75) Inventors: Se-myeong Jang, Anyang-si (KR); Dae-ik Kim, Yongin-si (KR); Hye-rim Park, Suwon-si (KR); Chang-suk Hyun, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/850,124

(22) Filed: Aug. 4, 2010

(65) Prior Publication Data

US 2011/0034004 A1 Feb. 10, 2011

(30) Foreign Application Priority Data

Aug. 5, 2009 (KR) .................. 10-2009-0072112

(51) Int. Cl.
*H01L 21/76* (2006.01)
(52) U.S. Cl. .. 438/424; 438/427; 438/430; 257/E21.546
(58) Field of Classification Search .................. 438/424, 438/427, 430
See application file for complete search history.

(56) References Cited

U.S. PATENT DOCUMENTS

| | | | | |
|---|---|---|---|---|
| 6,383,907 B1 * | 5/2002 | Hasegawa et al. | ............. | 438/597 |
| 6,596,607 B2 * | 7/2003 | Ahn | ............... | 438/424 |
| 7,235,459 B2 | 6/2007 | Sandhu | | |
| 7,563,689 B2 * | 7/2009 | Hong | .............. | 438/426 |
| 7,855,148 B2 * | 12/2010 | Olson | .......... | 438/699 |
| 2006/0240636 A1 * | 10/2006 | Ryu et al. | ....... | 438/424 |
| 2007/0235785 A1 * | 10/2007 | Kahng et al. | ......... | 257/297 |
| 2009/0029523 A1 * | 1/2009 | Seo et al. | ....... | 438/425 |
| 2009/0269898 A1 * | 10/2009 | Kim | .............. | 438/294 |

FOREIGN PATENT DOCUMENTS

| | | |
|---|---|---|
| KR | 10-0443126 | 2/2004 |
| KR | 10-0801739 A | 1/2008 |

* cited by examiner

*Primary Examiner* — Alexander G Ghyka
(74) *Attorney, Agent, or Firm* — Harness, Dickey & Pierce, P.L.C.

(57) ABSTRACT

A method of fabricating a semiconductor device, the method including forming a buffer oxide layer in a first region and a second region of a semiconductor substrate; forming a plurality of first preliminary mask patterns on the buffer oxide layer in the first region; forming a plurality of second preliminary mask patterns between every two adjacent first preliminary mask patterns from among the plurality of first preliminary mask patterns, respectively; forming a plurality of first mask patterns and a plurality of second mask patterns by trimming the plurality of first preliminary mask patterns and the plurality of second preliminary mask patterns; forming a plurality of first active region mask patterns for exposing the semiconductor substrate; defining a plurality of active regions in the semiconductor substrate by forming a trench including a plurality of first trench spaces having same width as the first space and a plurality of second trench spaces under the second space in the first region; and forming a first liner layer on the semiconductor substrate having the trench therein such that the plurality of first trench spaces are completely filled with the first liner layer.

10 Claims, 13 Drawing Sheets

METHOD OF FABRICATING SEMICONDUCTOR DEVICE

CROSS-REFERENCE TO RELATED APPLICATIONS

This application claims the benefit of Korean Patent Application No. 10-2009-0072112, filed on Aug. 5, 2009, in the Korean Intellectual Property Office, the disclosure of which is incorporated herein in its entirety by reference.

BACKGROUND

The inventive concept relates to a method of fabricating a semiconductor device, and more particularly, to a method of fabricating a semiconductor device in which an isolation layer is formed in a plurality of trenches.

Advances in the electronics industry lead to increases in the operating speed and performance of semiconductor devices. The integration density of semiconductor devices has been increased more and more in order to increase both the operating speed and performance thereof. Therefore, distances between elements included in a semiconductor device have also reduced, and thus, it is important to form an isolation layer in order to electrically disconnect the elements from one another. However, an increase in the integration degree of a semiconductor device results in a decrease in the critical dimension of an isolation layer, thereby degrading the electrical performance of the semiconductor device.

SUMMARY

The inventive concept provides a method of fabricating a semiconductor device having an isolation layer.

According to an aspect of the inventive concept, there is provided a method of fabricating a semiconductor device, the method including forming a buffer oxide layer in a first region and a second region of a semiconductor substrate; forming a plurality of first preliminary mask patterns on the buffer oxide layer in the first region, the plurality of first preliminary mask patterns being arranged according to a first pitch in a first direction; forming a plurality of second preliminary mask patterns between every two adjacent first preliminary mask patterns from among the plurality of first preliminary mask patterns, respectively, the plurality of first preliminary mask patterns and the plurality of second preliminary mask patterns being spaced apart by a first space from one another; forming a plurality of first mask patterns and a plurality of second mask patterns by trimming the plurality of first preliminary mask patterns and the plurality of second preliminary mask patterns, where the plurality of first mask patterns are spaced apart by a second space from one another and the plurality of second mask patterns are spaced apart by the second space from one another; forming a plurality of first active region mask patterns for exposing the semiconductor substrate by etching the buffer oxide layer by using the plurality of first mask patterns and the plurality of second mask patterns as an etch mask; defining a plurality of active regions in the semiconductor substrate by forming a trench including a plurality of first trench spaces having a same width as the first space and a plurality of second trench spaces under the second space in the first region by using the plurality of first active region mask patterns as an etch mask, where the plurality of active regions are arranged according to a half pitch of the first pitch in the first direction, and wherein the plurality of second trench spaces are wider than the plurality of first trench spaces; and forming a first liner layer on the semiconductor substrate having the trench therein such that the plurality of first trench spaces are completely filled with the first liner layer.

The forming of the plurality of second preliminary mask patterns may include forming a buffer layer having a first recessed upper surface on the plurality of first preliminary mask patterns and between every two adjacent first preliminary mask patterns from among the plurality of first preliminary mask patterns; and forming the plurality of second preliminary mask patterns on the first recessed upper surface of the buffer layer, where upper surfaces of the plurality of second preliminary mask patterns are level with upper surfaces of the plurality of second preliminary mask patterns. Before forming the plurality of first mask patterns and the plurality of second mask patterns, the buffer layer may be partially removed to expose the upper surfaces of the plurality of first preliminary mask patterns. The plurality of first preliminary mask patterns and the plurality of second preliminary mask patterns may be formed to have a width that is one quarter of the first pitch.

After forming the plurality of first preliminary mask patterns and before forming the buffer layer, the method may further include forming a plurality of lower surface portions of the buffer oxide layer by removing an upper part of the buffer oxide layer exposed between the plurality of first preliminary mask patterns by a first thickness. The buffer layer may be formed to the first thickness and evenly covers the plurality of first preliminary mask patterns and the plurality of lower surface portions.

The trench may further include a third trench space. A plurality of third mask patterns may be formed together with the plurality of first mask patterns and the plurality of second mask patterns formed on the buffer oxide layer in the second region, where the plurality of third mask patterns are arranged having a pitch greater than the first pitch. While the plurality of first active region mask patterns are formed, a plurality of second active region mask patterns may be formed in the second region by using the plurality of third mask patterns as an etch mask. While the first trench spaces and the second trench spaces are formed, the third trench space may be faulted in the second region wider than the first and second trench spaces by using the plurality of second active region mask patterns as an etch mask.

The method may further include forming a first trench oxide layer between the semiconductor substrate having the trench therein and the first liner layer.

During the forming of the first liner layer, the first liner layer may be formed to cover surfaces of the third trench space without filling a third recessed part of the third trench space. The method may further include partially removing the first liner layer and the first trench oxide layer, such that the first liner layer and the first trench oxide layer remain in the first trench spaces, a top surface of the semiconductor substrate having the trench is exposed, and the semiconductor substrate is exposed via the third trench space.

After the first liner layer and the first trench oxide layer are partially removed, a second trench oxide layer and a third trench oxide layer may be formed to completely fill the third trench space.

During the forming of the first liner layer, the first liner layer may be formed to cover surfaces of the second trench spaces without filling second recessed parts of the second trench spaces. When the first liner layer and the first trench oxide layer are partially removed, the semiconductor substrate may be exposed via the second trench spaces. When the second trench oxide layer and the third trench oxide layer are formed, the second trench spaces may be completely filled with the second and third trench oxide layers.

The method may further include a second liner layer between the second trench oxide layer and the third trench oxide layer.

During the forming of the first liner layer, the first liner layer may be formed to cover surfaces of the second trench spaces and the third trench space without filling second recessed parts of the second trench spaces and a third recessed part of the third trench space. The method may further include forming a fourth trench oxide layer on the first liner layer such that the second and third trench spaces are completely filled with the fourth trench oxide layer; and partially removing the first liner layer to partially expose the first trench oxide layer on a top surface of the semiconductor substrate having the trench therein.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Hereinafter, exemplary embodiments of a method of fabricating a semiconductor device according to the inventive concept will be described in detail with reference to the accompanying drawings. While the inventive concept has been particularly shown and described with reference to exemplary embodiments thereof, it will be understood by those of ordinary skill in the art that various changes in form and details may be made therein without departing from the spirit and scope of the inventive concept as defined by the appended claims.

It will be understood that, although the terms, first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
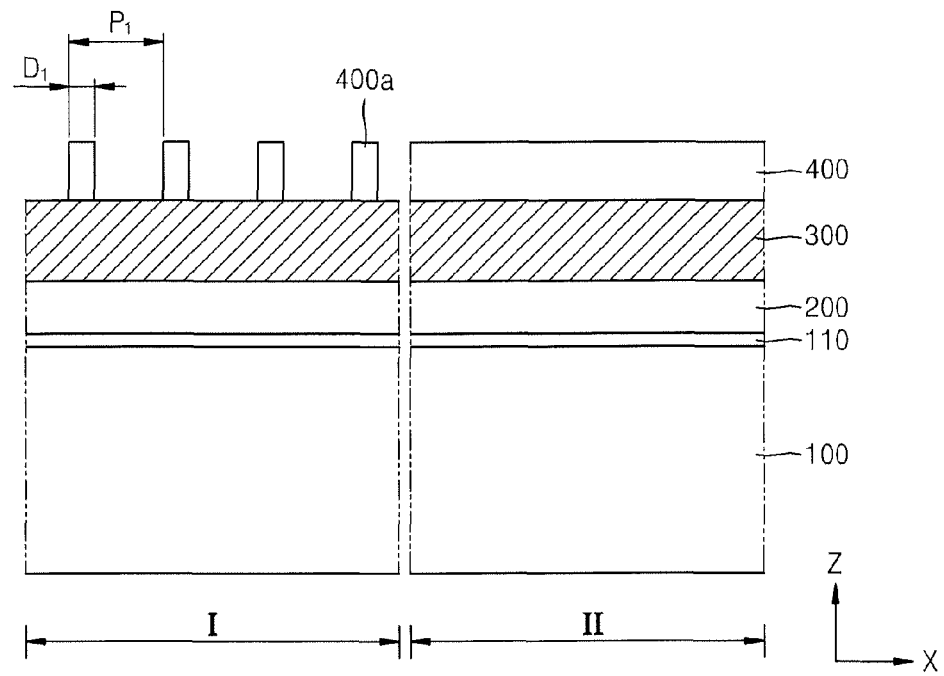
FIGS. 1 through 11E are cross-sectional and a plan views sequentially illustrating a method of fabricating a semiconductor device according to an embodiment of the inventive concept.

FIGS. 1 through 11E are cross-sectional and a plan views illustrating sequentially a method of fabricating a semiconductor device according to an embodiment of the inventive concept. Specifically, FIG. 1 is a cross-sectional view illustrating forming of a photoresist layer 400 and a plurality of photoresist patterns 400a on a semiconductor substrate 100 having a buffer oxide layer 200 and a hard mask layer 300 formed thereon.

Referring to FIG. 1, the semiconductor substrate 100 may be divided into a first region I and a second region II. The semiconductor substrate 100 may be a general semiconductor substrate, such as a silicon wafer. For example, the first region I may be a cell array region of a memory device, and the second region II may be a core or peripheral circuit region of the memory device. The buffer oxide layer 200 is formed on the semiconductor substrate 100. The buffer oxide layer 200 may be, for example, an oxide layer, such as a silicon oxide layer, formed by chemical vapor deposition (CVD). A pad oxide layer 110 may be formed between the semiconductor substrate 100 and the buffer oxide layer 200. The pad oxide layer 110 may be, for example, a silicon oxide layer that is grown from the semiconductor substrate 100 via thermal oxidation. The pad oxide layer 110 may be formed to a relatively thin thickness of 50 to 200 Å, whereas the buffer oxide layer 200 may be formed to a relatively thick thickness of 500 Å or more.

The hard mask layer 300 is formed on the buffer oxide layer 200. The hard mask layer 300 may be formed of poly silicon. The photoresist layer 400 and the photoresist patterns 400a may be formed on the hard mask layer 300 via a general photolithography process. In the first region I, the photoresist patterns 400a are formed having a first pitch $P_1$. In the first region I, a first width $D_1$ of each of the photoresist patterns 400a may be one quarter of the first pitch $P_1$ thereof. For example, in the first region I, the photoresist patterns 400a may be a plurality of line patterns that are arranged according to the first pitch $P_1$ in a first direction (x-axis direction) on the semiconductor substrate 100. The photoresist layer 400 may be formed to entirely cover the second region II. Otherwise, the photoresist layer 400 may be formed to partially cover the second region II if needed.

Figure 2:
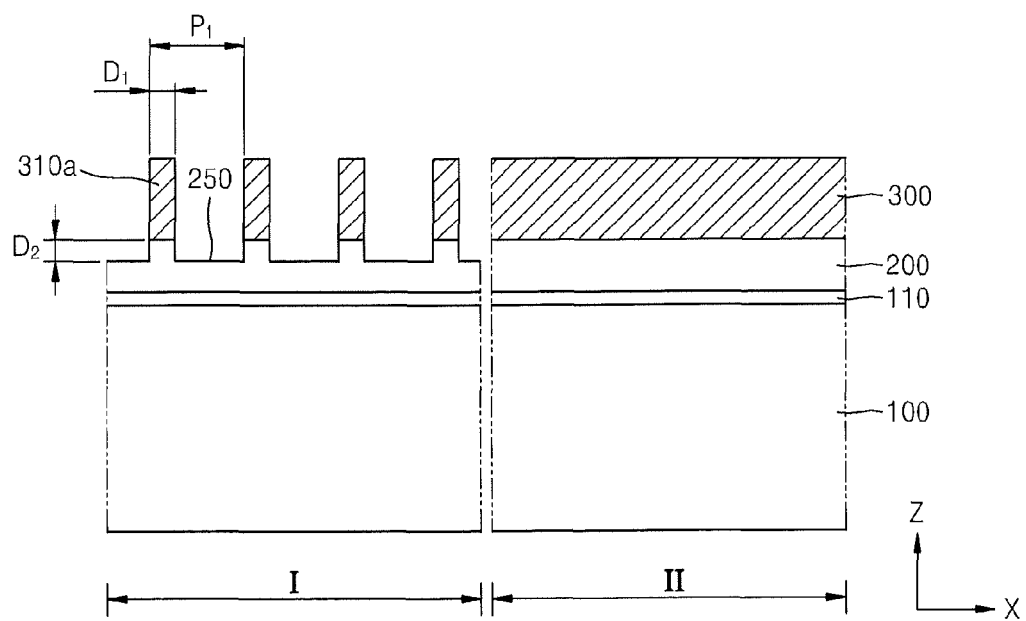

FIG. 2 is a cross-sectional view illustrating forming of a plurality of first preliminary mask patterns 310a. Referring to FIG. 2, the hard mask layer 300 is etched using the photoresist layer 400 and the photoresist patterns 400a of FIG. 1 as an etch mask in order to form the first preliminary mask patterns 310a in the first region I. In this case, the hard mask layer 300 may be unchanged in the second region II. In the first region I, the first preliminary mask patterns 310a are formed having the first pitch $P_1$. The first preliminary mask patterns 310a in the first region I may have the same width as the photoresist patterns 400a, that is, D1, of FIG. 1. For example, the first preliminary mask patterns 310a may be a plurality of line patterns that are arranged according to the first pitch $P_1$ in the first direction (x-axis direction) on the semiconductor substrate 100.

When the first preliminary mask patterns 310a are formed, an amount corresponding to a second thickness D2 of parts of the buffer oxide layer 200 that are exposed between the first preliminary mask patterns 310a may also be removed, thereby forming lower surface portions 250 of the buffer oxide layer 200. The second thickness $D_2$ may be equal to the first width $D_1$. Dry etching may be performed in order to obtain the lower surface portions 250 of the buffer oxide layer 200. For example, dry etching may be performed to form the first preliminary mask patterns 310a and then continued to over-etch the buffer oxide layer 200 to form the lower surface portions 250. Alternatively, dry etching may be performed separately in order to obtain the lower surface portions 250.

Figure 3:
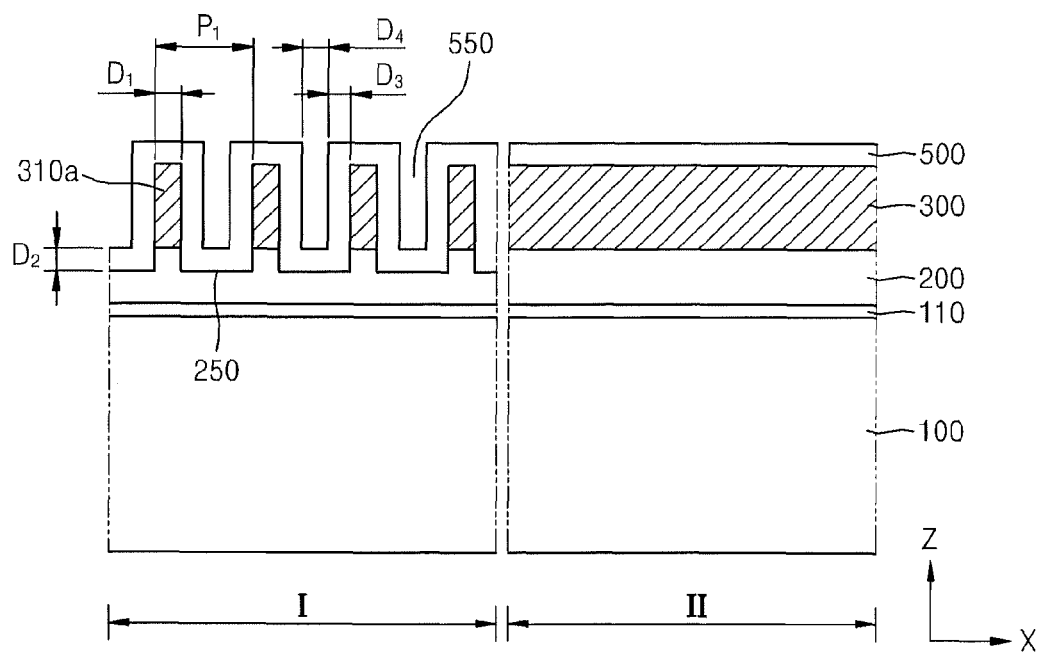

FIG. 3 is a cross-sectional view illustrating forming of a buffer layer 500 on the semiconductor substrate 100 having the first preliminary mask patterns 310a formed thereon. Referring to FIG. 3, a buffer layer 500 is formed on the first preliminary mask patterns 310a in such a way that a first recess 550 is formed between every two adjacent first preliminary mask patterns 310a. The buffer layer 500 is used as a buffer in order to equalize the height of the first preliminary mask patterns 310a, which are to be used as an etch mask for patterning the buffer oxide layer 200, with the height of second preliminary mask patterns 610a illustrated in FIG. 5 that are to be formed in the first recesses 550 in a subsequent process.

The buffer layer 500 may be formed evenly covering upper surfaces and sidewalls of the first preliminary mask patterns 310a and the lower surface portions 250 of the buffer oxide layer 200. For example, the buffer layer 500 may be formed to a third thickness $D_3$ evenly covering the first preliminary mask patterns 310a and the lower surface portions 250 of the buffer oxide layer 200. Also, the third thickness $D_3$ of the buffer layer 500 is such that a fourth width $D_4$ of each of the first recesses 550 defined by surfaces of the buffer layer 500 may be equal to the first width $D_1$ of the first preliminary mask patterns 310a. That is, the first to fourth widths/thicknesses $D_1$ to $D_4$ may be equal to one another.

The buffer layer 500 may be formed of a material that has the same etching characteristics as the buffer oxide layer 200. For example, the buffer layer 500 and the buffer oxide layer 200 may be formed of the same material or may be formed of different materials having similar etching characteristics. For example, the buffer oxide layer 200 and the buffer layer 500 may be oxide layers. The buffer layer 500 may be an oxide layer formed via atomic layer deposition (ALD).

Figure 4:
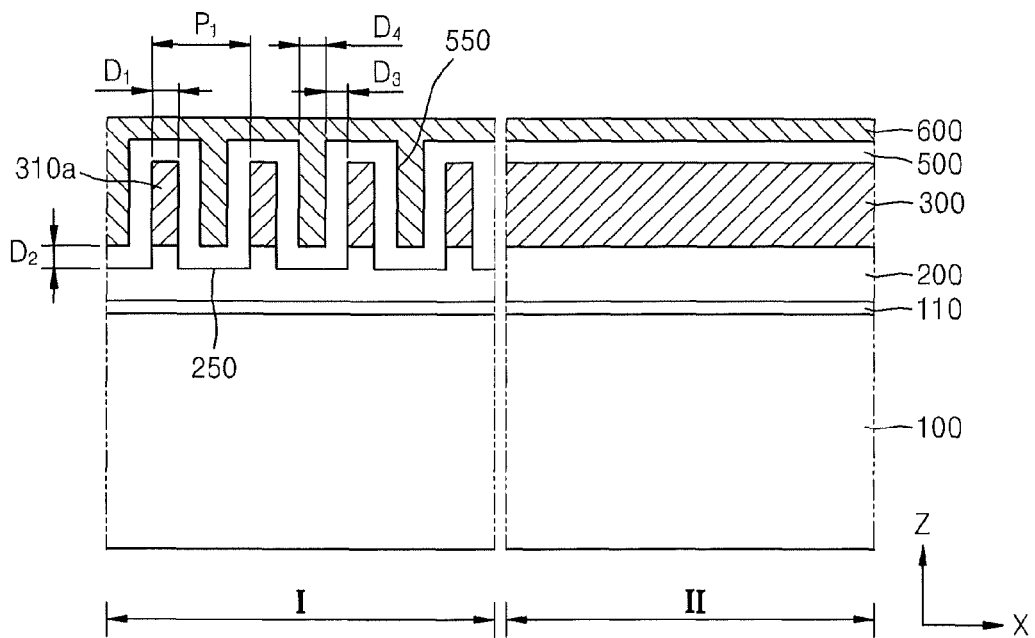

FIG. 4 is a cross-sectional view illustrating forming of a second preliminary mask layer 600 on the semiconductor substrate 100 having the buffer layer 500 formed thereon. Referring to FIG. 4, the second preliminary mask layer 600 is formed on the semiconductor substrate 100 having the buffer layer 500 formed thereon. The second preliminary mask layer 600 may be formed of, for example, poly silicon. In forming the second preliminary mask layer 600, the second preliminary mask layer 600 entirely fills the first recesses 550. If the third thickness $D_3$ of the buffer layer 500 is one quarter of the first pitch $P_1$, then widths of parts of the second preliminary mask layer 600 that are filled in the first recesses 550, i.e., the fourth width $D_4$ of the first recesses 550, may be one quarter of the first pitch $P_1$ and may thus be equal to the first width $D_1$ of the first preliminary mask patterns 310a.

Figure 5:
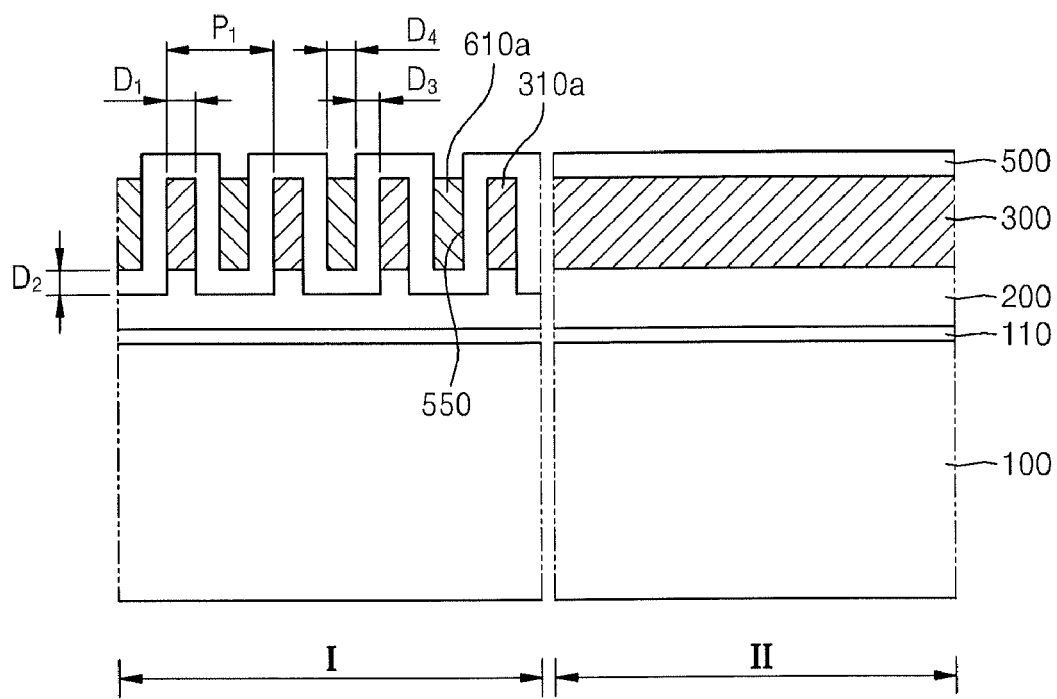

FIG. 5 is a cross-sectional view illustrating forming of the second preliminary mask patterns 610a. Referring to FIG. 5, the second preliminary mask patterns 610a are formed in the first recesses 550 by removing a part of the second preliminary mask layer 600. Then, the buffer layer 500 that covers the first preliminary mask patterns 310a is partially exposed between the second preliminary mask patterns 610a. Also, a part of the second preliminary mask layer 600 that entirely covers the second region II, is entirely removed, thus exposing the buffer layer 500 in the second region II.

In partially removing the second preliminary mask layer 600, the amount of etching of the second preliminary mask layer 600 may be controlled to same level upper surfaces of the second preliminary mask patterns 610a with those of the first preliminary mask patterns 310a. For example, wet etching may be performed in order to partially remove the second preliminary mask layer 600.

For example, the second preliminary mask patterns 610a may be a plurality of line patterns that extend in the direction in which the first preliminary mask patterns 310a extend. The upper surfaces of the second preliminary mask patterns 610a remaining in the first recesses 550 may be same level with those of the first preliminary mask patterns 310a. Such a method of forming the first preliminary mask patterns 310a and the second preliminary mask patterns 610a is referred to as double patterning.

Figure 6A:
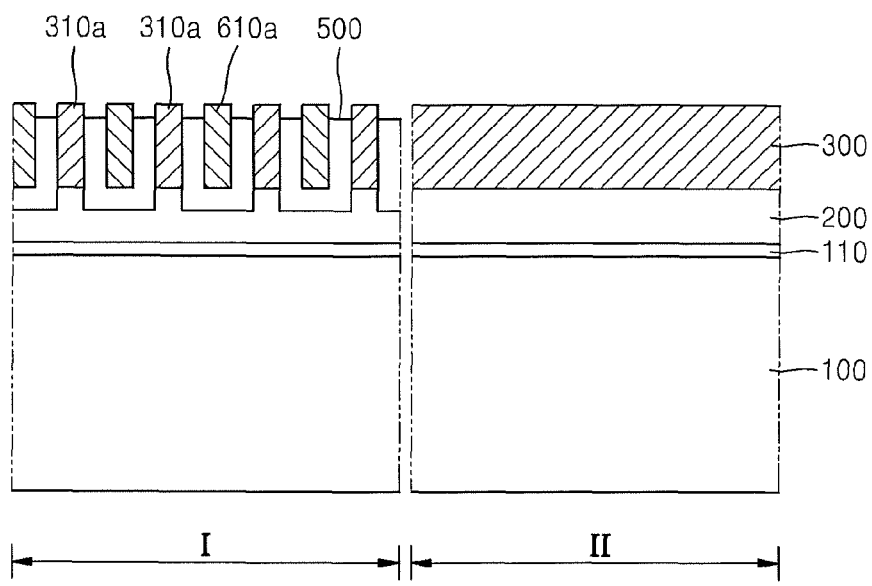
Figure 6B:
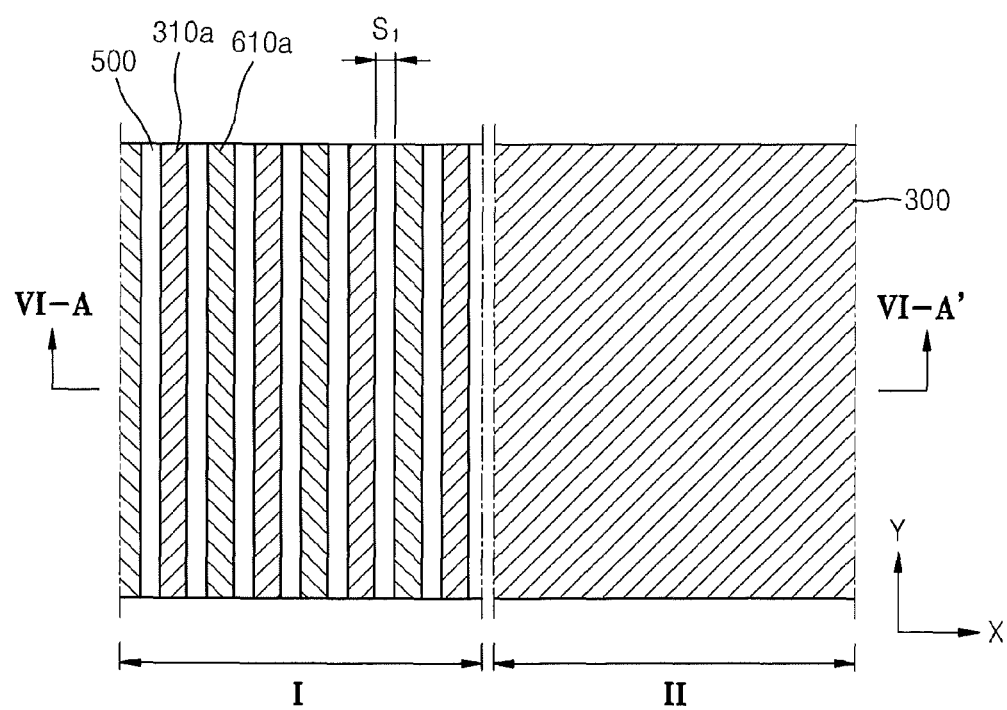

FIGS. 6A and 6B are a cross-sectional and a plan view illustrating partial removal of the buffer layer 500, respectively. FIG. 6A is a cross-sectional view taken along line VI-A-VI-A' of FIG. 6B. Referring to FIGS. 6A and 6B, the exposed parts of the buffer layer 500, that is, the parts of the buffer layer 500 that cover the upper surfaces of the first preliminary mask patterns 310a, are removed in order to expose the upper surfaces of the first preliminary mask patterns 310a. Thus, both the upper surfaces of both the first preliminary mask patterns 310a and the second preliminary mask patterns 610a are exposed on the semiconductor substrate 100. For example, the first and second preliminary mask patterns 310a and 610a may extend in a second direction (y-axis direction) perpendicular to the first direction (x-axis direction). The plurality of first preliminary mask patterns 301a and the plurality of second preliminary mask patterns 610a may be spaced apart by a first space S one another. The first space $S_1$ may be equal to the third thickness $D_3$ illustrated in FIG. 5 Upper side surfaces of both the first preliminary mask patterns 310a and the second preliminary mask patterns 610a may also be partially exposed if needed. The partial removal of the buffer layer 500 may be omitted in some cases.

Wet etching may be performed in order to remove the parts of the buffer layer 500 that cover the upper surfaces of the first preliminary mask pattern 310. For example, if the buffer layer 500 is an oxide layer, then an etching solution containing fluorine (F) selected from the group consisting of diluted hydrofluoric acid (DHF), $NH_4F$, and a combination thereof may be used in order to selectively remove only the buffer layer 500 to have high etch selectivity to the first preliminary mask patterns 310a and the second preliminary mask patterns 610a.

Alternatively, dry etching may be performed in order to remove the parts of the buffer layer 500 that cover the upper surfaces of the first preliminary mask patterns 310a. In this case, either a $C_xF_y$ gas or a mixture gas of $C_xF_y$, $O_2$, and argon (Ar) may be used as an etch gas, where x and y are integers in the range of 1 to 10. For example, a $C_4F_6$ gas or a $C_4F_8$ gas may be used as the $C_xF_y$ gas.

In this case, in the second region II, the upper surfaces of the buffer layer 500 may be entirely exposed, and thus, the buffer layer 500 may be removed completely in order to expose the hard mask layer 300.

Figure 7A:
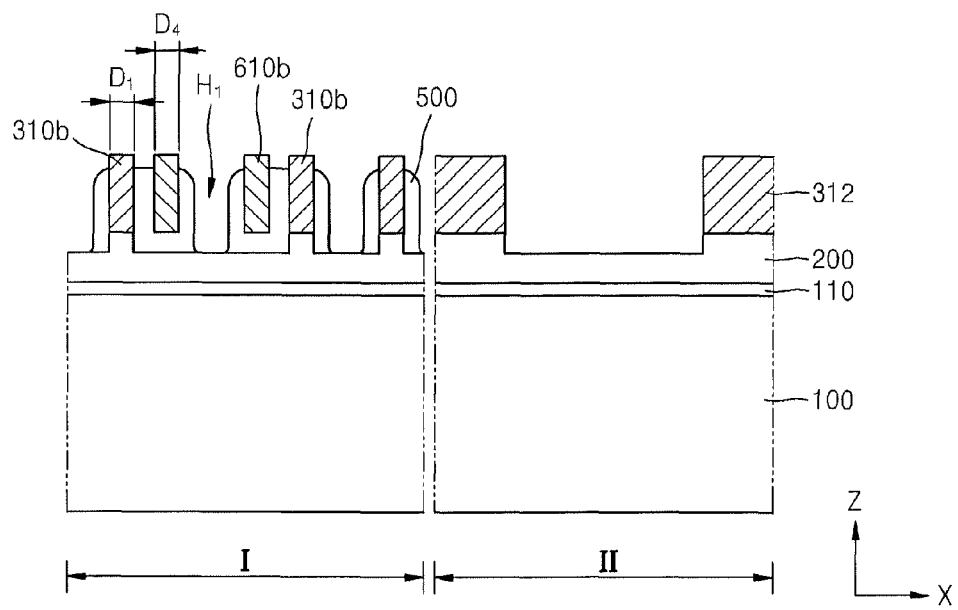
Figure 7B:
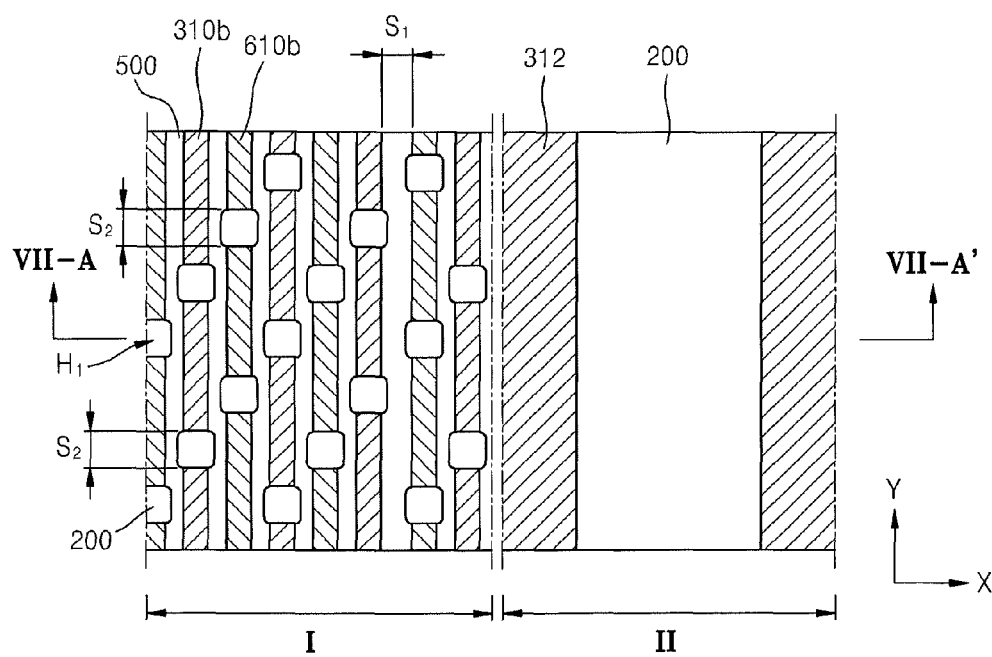

FIGS. 7A and 7B are a cross-sectional and a plan view illustrating forming of first mask patterns 310b and second mask patterns 610b. FIG. 7A is a cross-sectional view taken along line VII-A-VII-A' of FIG. 7B. Referring to FIGS. 7A and 7B, the first mask patterns 310b and the second mask patterns 610b are formed by trimming the first preliminary mask patterns 310a and the second preliminary mask patterns 610a illustrated in FIGS. 6A and 6B. The first mask patterns 310b and the second mask patterns 610b may be formed by trimming the first preliminary mask patterns 310a and the second preliminary mask patterns 610a, such that every one of the plurality of first mask patterns 310b are spaced apart by a second space $S_2$ from one another and every one of the plurality of second mask patterns 610b are spaced apart by the second space $S_2$ from one another. A plurality of trimming holes $H_1$ are formed between adjacent pairs of the first mask patterns 310b and adjacent pairs of the second mask patterns 610b within the second space $S_2$. The second space $S_2$ may be greater than the first width $D_1$ of the first preliminary mask patterns 310a and the fourth width $D_4$ of the second preliminary mask patterns 610a. The trimming holes $H_1$ may be formed to have a lower bottom surface than those of the first mask patterns 310b and the second mask patterns 610b, so that each of the first mask patterns 310b and the second mask patterns 610b may be completely separated from the other.

The third mask patterns 312 are formed by partially etching the hard mask layer 300 in the second region II simultaneously while forming the trimming holes $H_1$. The third mask patterns 312 or spaces between the third mask patterns 312 may have various widths. However, the widths thereof will not be additionally illustrated in the drawings. However, the widths of the spaces between the third mask patterns 312 and the third mask patterns 312 may be greater than the first width $D_1$ and the fourth width $D_4$.

The first mask patterns 310b, the second mask patterns 610b, and the third mask patterns 312 may be formed by performing a photolithography process and an etching process using photoresist pattern which exposes a part of a top surface of the hard mask layer 300 in the second region II and parts of the first and second preliminary mask patterns 310a and 610a.

The cross-sectional views illustrated in FIGS. 1 to 6A, 7B, and 8 to 11E may be taken along a line with the first direction (x-axis direction) perpendicular to the second direction (y-axis direction) along which the first preliminary mask patterns 310a and the second preliminary mask patterns 610a extend. Otherwise, these cross-sectional views may be taken along a line that makes an angle of 0 to 45 degrees with a direction perpendicular to the second direction (y-axis direction) along which the first preliminary mask patterns 310a and the second preliminary mask patterns 610a extend. Whether the former or latter method is employed may be determined according to location of an active region in the semiconductor device. However, for convenience of explanation, even if these cross-sectional views are not taken according to the former method, widths or thicknesses of elements have been described in the present specification on an assumption that the elements have a cut end perpendicular to the second direction (y-axis direction) along which the first preliminary mask patterns 310a and the second preliminary mask patterns 610a extend.

Figure 8:
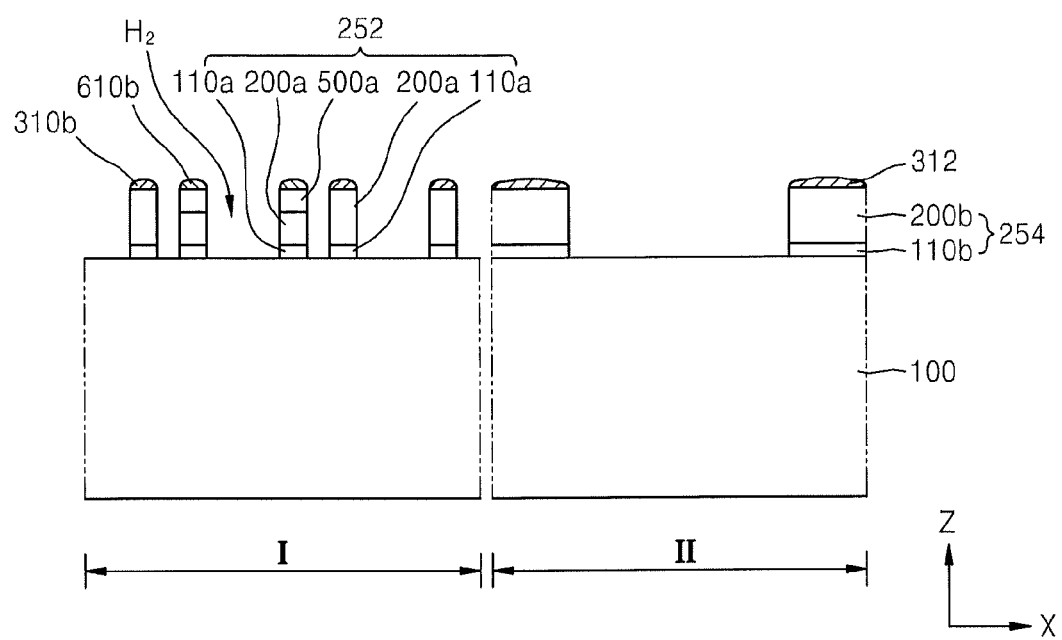

FIG. 8 is a cross-sectional view illustrating forming of first active region mask patterns 252 and second active region mask patterns 254. Referring to FIG. 8, the buffer layer 500 and the buffer oxide layer 200 are anisotropically etched by using the first mask patterns 310b and the second mask patterns 610b as etch masks in order to expose an upper surface of the semiconductor substrate 100 between the mask patterns 310b and the second mask patterns 610b. If the pad oxide layer 110 is present, the pad oxide layer 110 is also anisotropically etched to expose the upper surface of the semiconductor substrate 100 between the mask patterns 310b and the second mask patterns 610b. Then, the first active region mask patterns 252 are formed having a stacked structure of a remnant buffer layer 500a, a remnant buffer oxide layer 200a, and a remnant pad oxide layer 110a below the first and second mask patterns 310b and 610b. Specifically, below each of the first mask patterns 310b, each of the first active region mask patterns 252 may include a stacked structure of the remnant buffer oxide layer 200a and the remnant pad oxide layer 110a is formed as the first active region mask pattern 252, or a stacked structure of the remnant buffer layer 500a, the remnant buffer oxide layer 200a, and the remnant pad oxide layer 110a is formed as the first active region mask pattern 252.

The trimming holes $H_1$ are widened since the buffer layer 500 is removed from the side surfaces of the first mask patterns 310b and the second mask patterns 610b, becoming extended trimming holes $H_2$.

When the first active region mask patterns 252 are formed, the first mask patterns 310b and the second mask patterns 610b may remain partially on the first active region mask patterns 252. The remnant first mask patterns 310b and second mask patterns 610b may remain to be used as a part of an etch mask during a subsequent process.

Simultaneously while forming the first active region mask patterns 252, in the second region II, the buffer oxide layer 200 and the pad oxide layer 110 are anisotropically etched using the third mask patterns 312 as an etch mask, thereby exposing the upper surface of the semiconductor substrate 100 between the third mask patterns 312. The second active region mask patterns 254 are formed each having a stacked structure of a remnant buffer oxide layer 200b and a remnant pad oxide layer 110b below the third mask patterns 312.

When the second active region mask patterns 254 are formed, the third mask patterns 312 may remain partially on the second active region mask patterns 254. The remnant third mask patterns 312 may remain in order to be used as a part of an etch mask in a subsequent process.

Figure 9:
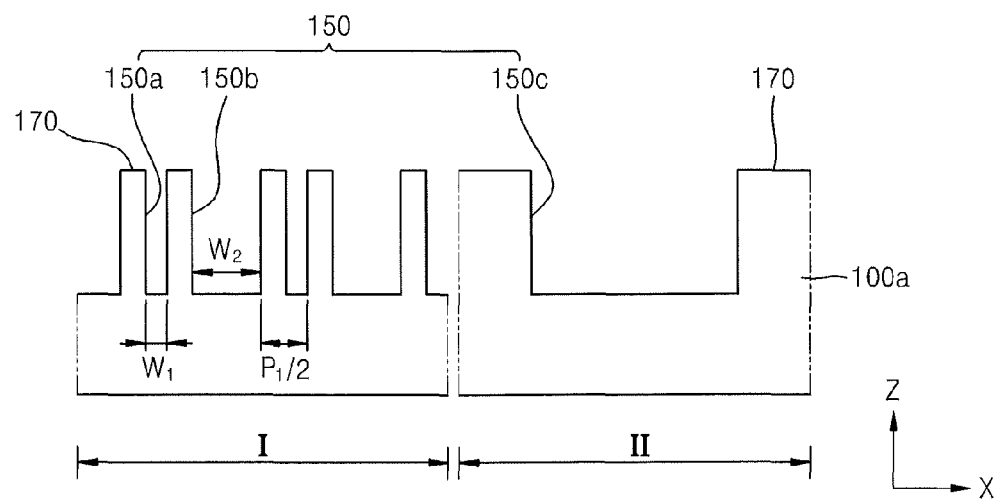

FIG. 9 is a cross-sectional view illustrating forming of a plurality of trenches 150. Referring to FIGS. 8 and 9, the semiconductor substrate 100 is anisotropically etched using the first active region mask patterns 252 as an etch mask in order to divide an upper part of the semiconductor substrate 100 into a plurality of active regions 170 that are arranged having a pitch half the first pitch $P_1$. Then, if the remnant first active region mask patterns 252 are removed, an etched semiconductor substrate 100a having the trenches 150 therein are formed.

The trenches 150 include a plurality of first trench spaces 150a and a plurality of second trench spaces 150b. Each of the first trench spaces 150a may have a first width $W_1$, and each of the second trench spaces 150b may have a second width $W_2$ that is greater than the first width $W_1$. Specifically, the first trench spaces 150a are formed by etching parts of the semiconductor substrate 100 that are exposed between adjacent first mask patterns 310b and second mask patterns 610b, and the second trench spaces 150b are formed by etching parts of the semiconductor substrate 100 that are exposed via the extended trimming holes $H_2$. That is, if it is assumed that the trenches 150 are formed using only the first preliminary mask patterns 310a and the second preliminary mask patterns 610a, then the first trench spaces 150a are formed to have same width as the first space $S_1$ by etching parts of the semiconductor substrate 100. The second trench spaces 150b are formed under the second space $S_1$. The first width $W_1$ of the first space 150a may be one quarter of the first pitch $P_1$, i.e., $P_1/4$, and the second width $W_2$ of the second space 150b may be three quarters of the first pitch $P_1$, i.e., $3 \times P_1/4$.

When the active regions 170 are formed, in the second region II, a plurality of third trench spaces 150c are formed by anisotropically dry etching the semiconductor substrate 100 by using the second active region mask patterns 254 as an etch mask. The trenches 150 may include the first trench spaces 150a, the second trench spaces 150b, and the third trench spaces 150c.

Figure 10:
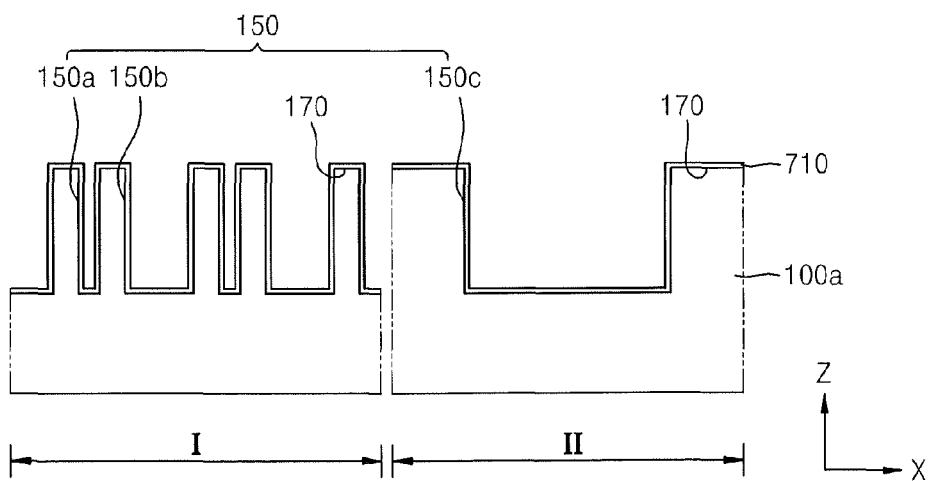

FIG. 10 is a cross-sectional view illustrating forming of a first trench oxide layer 710 on the etched semiconductor substrate 100a having the trenches 150. Referring to FIG. 10, the first trench oxide layer 710 is formed on the etched semiconductor substrate 100a having the trenches 150. The first trench oxide layer 710 may be formed to completely cover the top surface of the etched semiconductor substrate 100a in which the trenches 150 are formed, i.e., to completely cover all surfaces of the active regions 170 and the trenches 150. In this case, the thickness of the first trench oxide layer 710 may be such that the trenches 150 are not completely filled by the first trench oxide layer 710.

Figure 11A:
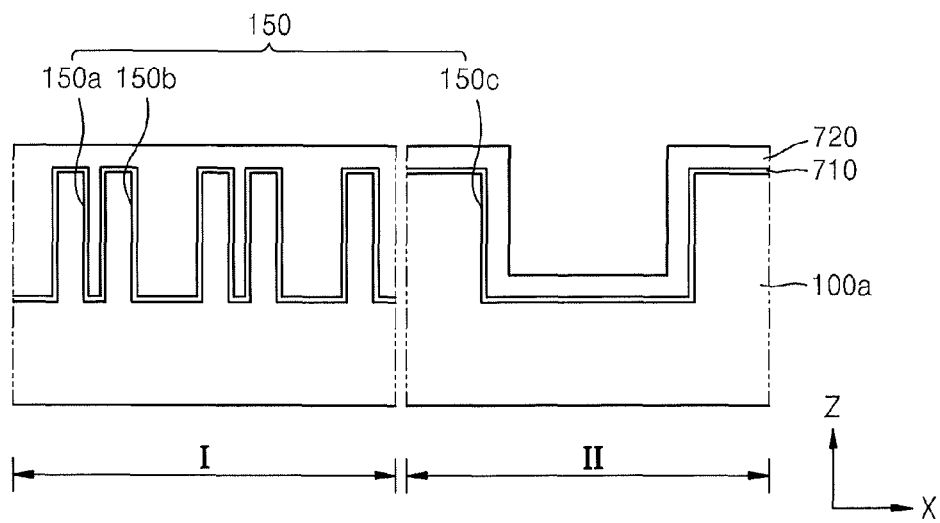

FIG. 11A is a cross-sectional view illustrating forming of a first liner layer 720 on the first trench oxide layer 710. Referring to FIG. 11A, the first liner layer 720 is formed on the etched semiconductor substrate 100a having the first trench oxide layer 710 (formed) thereon. The first liner layer 720 may be, for example, an insulating layer that includes either a silicon nitride layer or a nitride layer. The first liner layer 720 may be formed to completely fill the first trench spaces 150a and the second trench spaces 150b but may be formed to cover only surfaces of the third trench spaces 150c without filling recessed upper parts thereof. That is, the first liner layer 720 may be formed such that the third trench spaces 150c are not completely filled with the first liner layer 720. That is, the third trench spaces 150c in the second region II may be formed having a width greater than those of the first trench spaces 150a and the second trench spaces 150b. In this case, the thicknesses of the first trench oxide layer 710 and the first liner layer 720 covering the surfaces of the third trench spaces 150c may be equal to those of the first trench oxide layer 710 and the first liner layer 720 formed on the top surface of the etched semiconductor substrate 100a, i.e., the active regions 170, respectively.

Figure 11B:
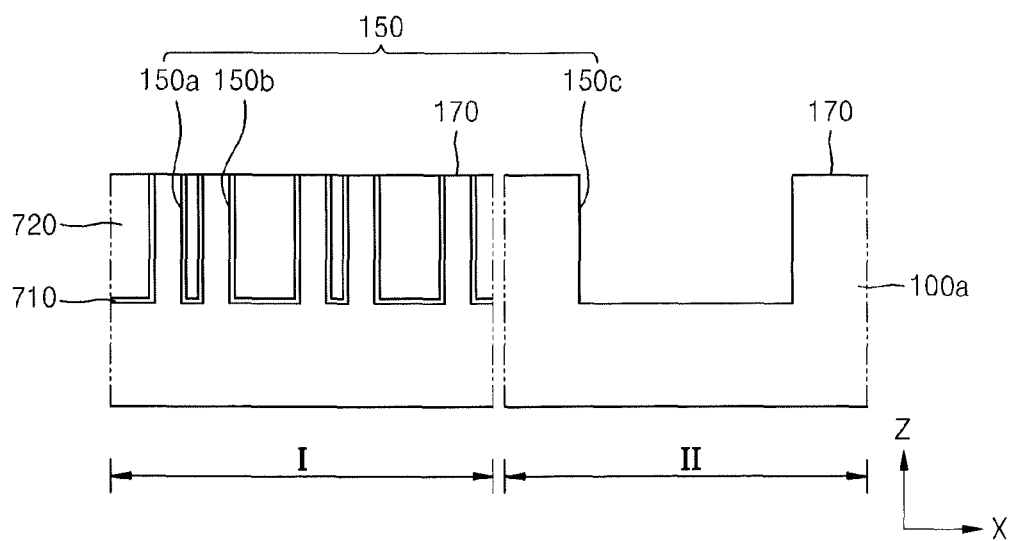

FIG. 11B is a cross-sectional view illustrating partial removal of the first trench oxide layer 710 and the first liner layer 720. Referring to FIG. 11B, the first trench oxide layer 710 and the first liner layer 720 are partially removed to expose upper surfaces of the active regions 170, which correspond to the top surface of the etched semiconductor substrate 100a. Since the first trench oxide layer 710 and the first liner layer 720 are formed to the same thickness on the surfaces of the third trench spaces 150c and the active regions 170, the first trench oxide layer 710 and the first liner layer 720 may be removed completely from all the surfaces of the third trench spaces 150c.

Figure 11C:
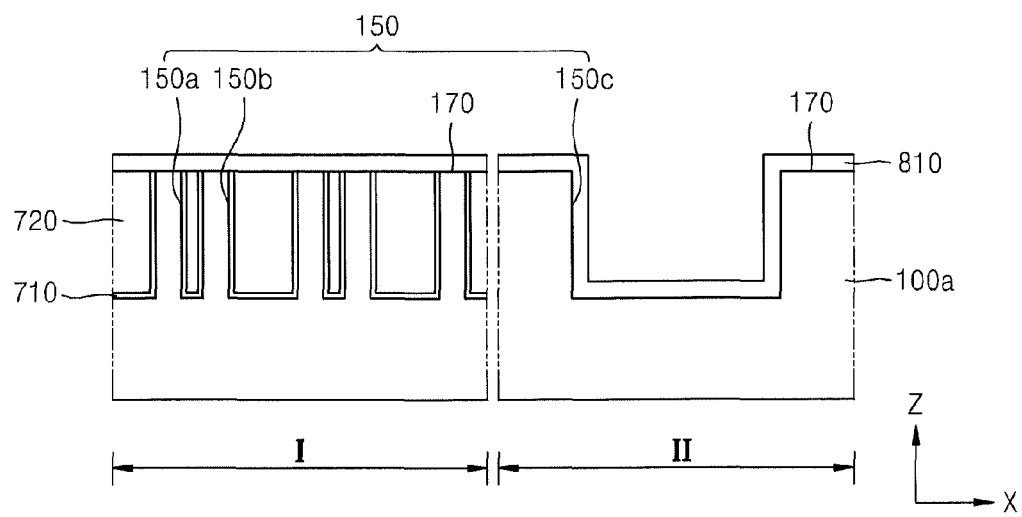

FIG. 11C is a cross-sectional view illustrating forming of a second trench oxide layer 810. Referring to FIG. 11C, the second trench oxide layer 810 is formed to cover the upper surfaces of the active regions 170 of the etched semiconductor substrate 100a. The thickness of the second trench oxide layer 810 may be greater than that of the first trench oxide layer 710. Also, the second trench oxide layer 810 may be formed to cover all the surfaces of the third trench spaces 150c without filling the recessed upper parts thereof.

Figure 11D:
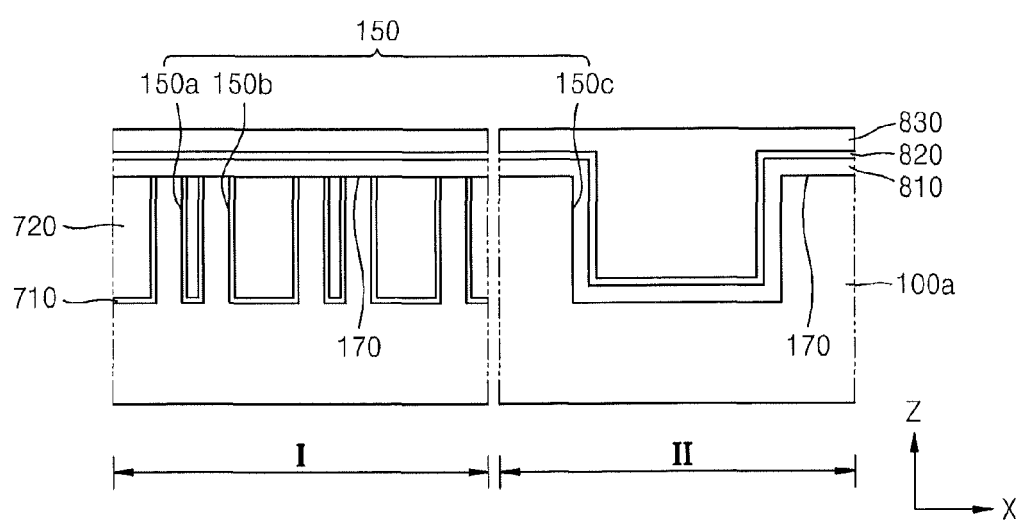

FIG. 11D is a cross-sectional view illustrating forming of a second liner layer 820 and a third trench oxide layer 830. Referring to FIG. 11D, the second liner layer 820 and the third trench oxide layer 830 are formed on the etched semiconductor substrate 100a having the second trench oxide layer 810 formed thereon. The second liner layer 820 may be, for example, an insulating layer containing either a silicon nitride layer or a nitride layer. The second liner layer 820 may be formed to cover all the surfaces of the third trench spaces 150c without filling the recessed upper parts thereof. The third trench oxide layer 830 may be formed to completely fill the third trench spaces 150c and on the second liner layer 820. The second liner layer 820 may be omitted if needed.

Figure 11E:
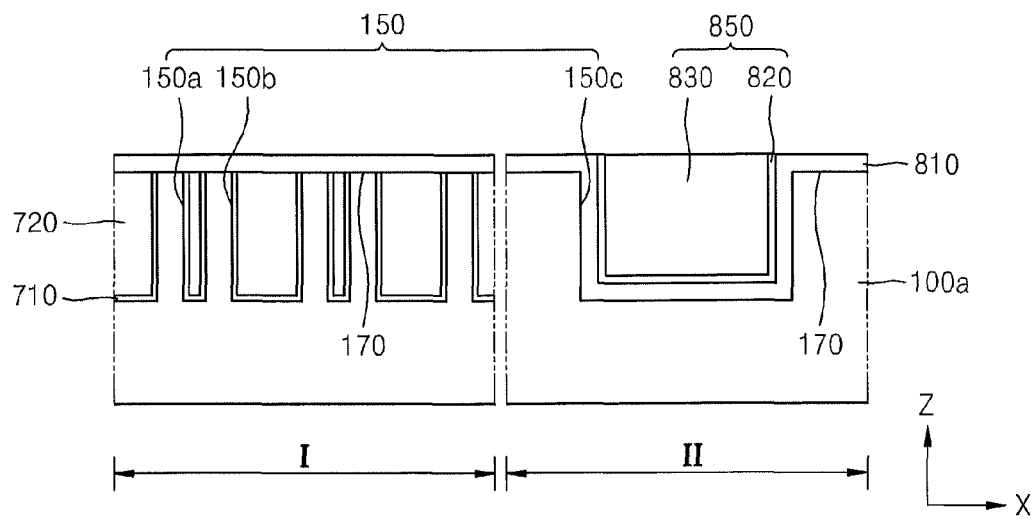

FIG. 11E is a cross-sectional view illustrating forming of an isolation layer 850. Referring to FIG. 11E, the isolation layer 850 is formed completely filling the trenches 150c by partially removing the third trench oxide layer 830 and the second liner layer 820 in order to expose the second trench oxide layer 810. An increase in the integration degree of the semiconductor device results in a reduction in the widths of the trenches 150. In this case, if trenches 150 are filled with an oxide layer, there may be a void in the trenches 150. Therefore, the first trench spaces 150a and the second trench spaces 150b that are narrower than the third trench spaces 150c from among the trenches 150 are filled with the first liner layer 720, and the third trench spaces 150c are filled with the third trench oxide layer 830, thereby increasing the electrical reliability of the semiconductor device.

The second trench oxide layer 810 may remain on the active regions 170 of the etched semiconductor substrate 100a, in which the trenches 150 are formed. The second trench oxide layer 810 may be used as sacrificial oxide layer during a subsequent ion implantation or etching process. Accordingly, an additional process of forming the sacrificial oxide layer may not be performed.

Furthermore, the thicknesses of the first trench oxide layer 710 formed on the surfaces of the first trench spaces 150a and the second trench spaces 150b, which are narrower than the third trench spaces 150c, may be different from those of the second trench oxide layer 810 formed on the surfaces of the third trench spaces 150c, thereby enhancing the electrical characteristics of the semiconductor device.

FIGS. 12A through 12D are cross-sectional views sequentially illustrating a method of fabricating a semiconductor device according to another embodiment of the inventive concept. In the current embodiment, first, the operations described above with reference to FIGS. 1 to 10 are performed.

Figure 12A:
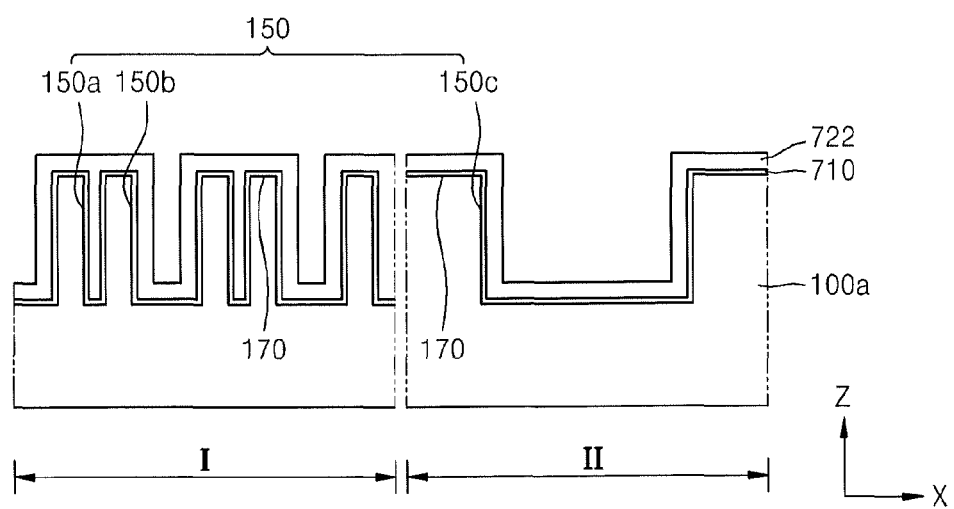
FIGS. 12A to 12D are cross-sectional views sequentially illustrating a method of fabricating a semiconductor device according to another embodiment of the inventive concept.

FIG. 12A is a cross-sectional view illustrating forming of a first liner layer 722 on a first trench oxide layer 710. Referring to FIG. 12A, the first liner layer 722 is formed on an etched semiconductor substrate 100a having the first trench oxide layer 710 formed thereon. The first liner layer 722 may be formed to completely fill first trench spaces 150a and may be formed to cover surfaces of second trench spaces 150b and a third trench spaces 150c without filling recessed upper parts thereof. That is, the insides of the second trench spaces 150b and third trench spaces 150c may not be completely filled with the first liner layer 722. Thus, the second trench spaces 150b and the third trench spaces 150c may have a wider width than the first spaces 150a. In this case, the thicknesses of the first trench oxide layer 710 and the first liner layer 722 formed on the surfaces of the second trench spaces 150b and the third trench spaces 150c may be equal to those of the first trench oxide layer 710 and the first liner layer 722 formed on a top surface of the etched semiconductor substrate 100a, i.e., on surfaces of active regions 170.

Figure 12B:
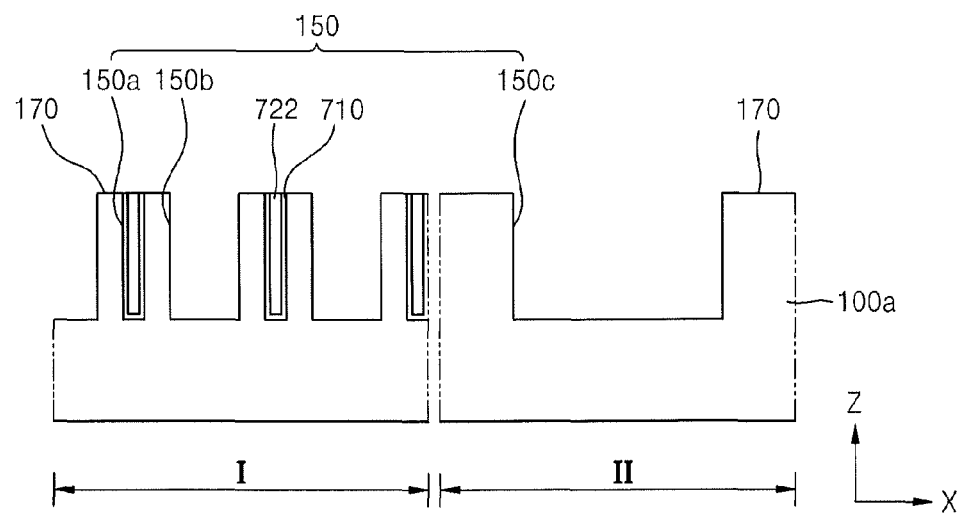

FIG. 12B is a cross-sectional view illustrating partial removal of the first trench oxide layer 710 and the first liner layer 722. Referring to FIG. 12B, the first trench oxide layer 710 and the first liner layer 722 are partially removed to expose the surfaces of the active region 170 of the etched semiconductor substrate 100a. Since the first trench oxide layer 710 and the first liner layer 722 are formed to the same thickness on the surfaces of the second trench spaces 150b and third trench spaces 150c and on the surfaces of the active regions 170, the first trench oxide layer 710 and the first liner layer 722 may be removed completely from the second trench spaces 150b and the third trench spaces 150c.

Figure 12C:
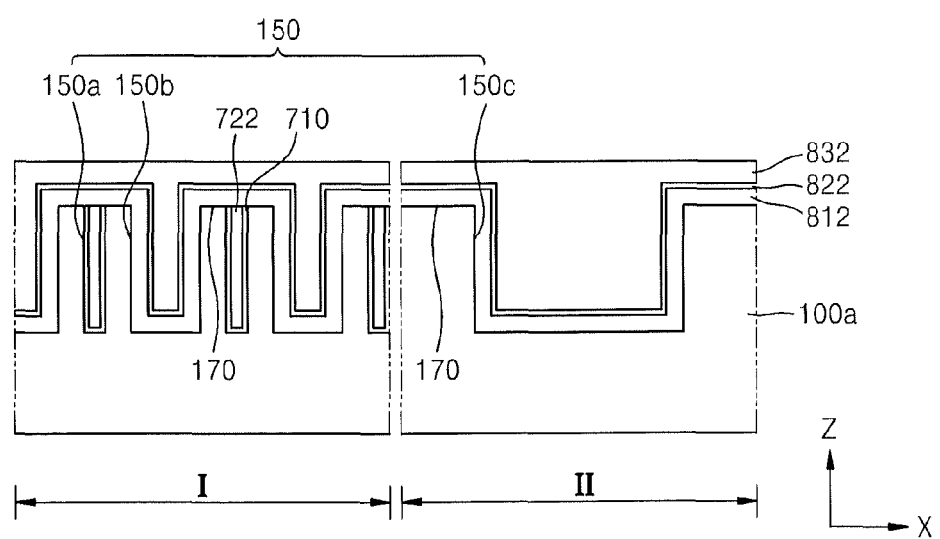

FIG. 12C is a cross-sectional view illustrating forming of a second trench oxide layer 812, a second liner layer 822, and a third trench oxide layer 832. Referring to FIG. 12C, the second trench oxide layer 812, the second liner layer 822, and the third trench oxide layer 832 are sequentially formed on the top surface of the etched semiconductor substrate 100a. The second liner layer 822 may be omitted if needed. The thickness of the second trench oxide layer 812 may be greater than that of the first trench oxide layer 710. The second trench oxide layer 812 and the second liner layer 822 may be formed to cover the surfaces of the second trench spaces 150b and the third trench spaces 150c without filling recessed upper parts thereof. However, the third trench oxide layer 832 may be formed to completely fill the third trench space 150c.

Figure 12D:
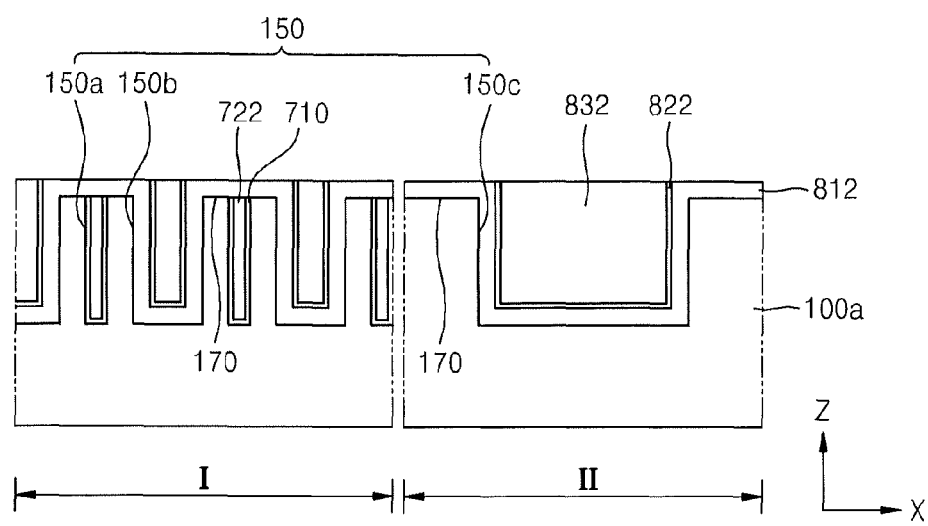

FIG. 12D is a cross-sectional view illustrating partial removal of the second liner layer 822 and the third trench oxide layer 832. Referring to FIG. 12D, the third trench oxide layer 832 and the second liner layer 822 are partially removed to expose the second trench oxide layer 812, thereby forming an isolation layer to completely fill the trenches 150.

An increase in the integration degree of the semiconductor device results in a reduction in the widths of the trenches 150. Thus, if the trenches 150 are filled by deposition of an oxide layer, there may be a void in the trenches. Accordingly, the first trench spaces 150a that are narrower than the second trench spaces 150b and the third trench spaces 150c among the trenches 150 are filled with the first liner layer 722 and the second trench spaces 150b and the third trench spaces 150c are filled with the third trench oxide layer 832 so that the trenches 150 may be completely filled with the first liner layer 722 and the third trench oxide layer 832, thereby enhancing the electrical reliability of the semiconductor device.

The second trench oxide layer 812 may remain on the top surface of the etched semiconductor substrate 100a having the trenches 150 therein, i.e., on the upper surfaces of the active regions 170. The second trench oxide layer 812 may be used as a sacrificial oxide layer during a subsequent ion implantation or etching process. Therefore, an additional process of forming the sacrificial oxide layer may not be performed.

Furthermore, the first spaces 105a having a relatively narrow width and the second and third spaces 150b and 105c having a relatively wide width are respectively filled with trench oxides having different thicknesses each other, thereby enhancing the electrical characteristics of the semiconductor device.

Figure 13A:
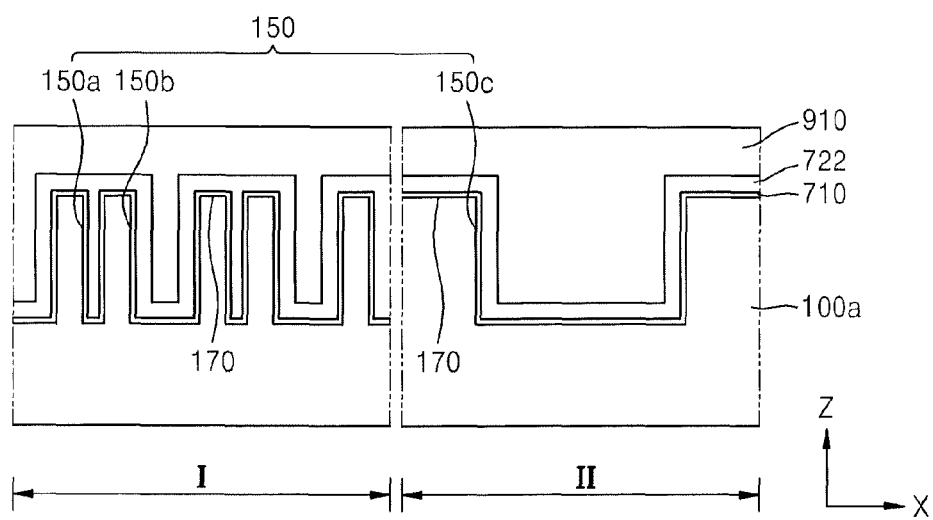
FIGS. 13A to 13C are cross-sectional views sequentially illustrating a method of fabricating a semiconductor device according to another embodiment of the inventive concept.
Figure 13B:
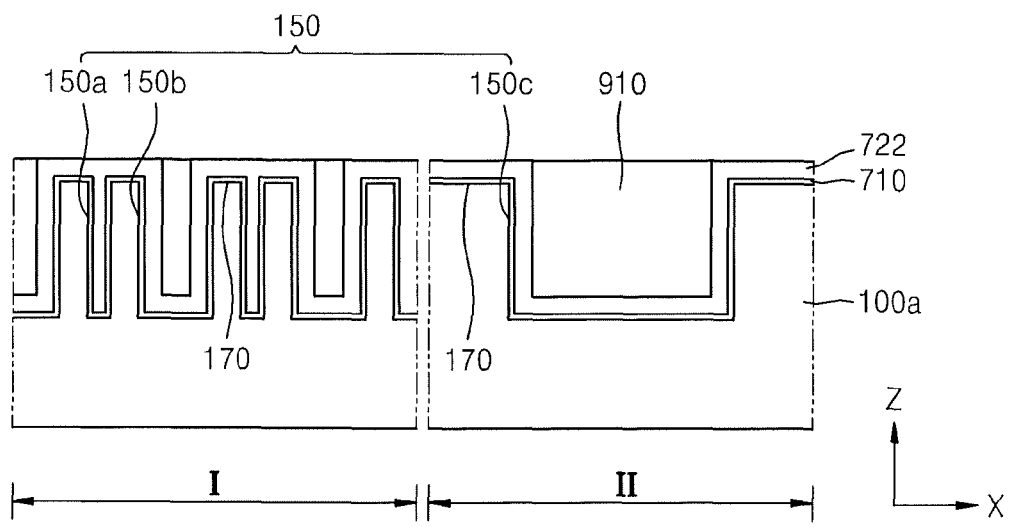
Figure 13C:
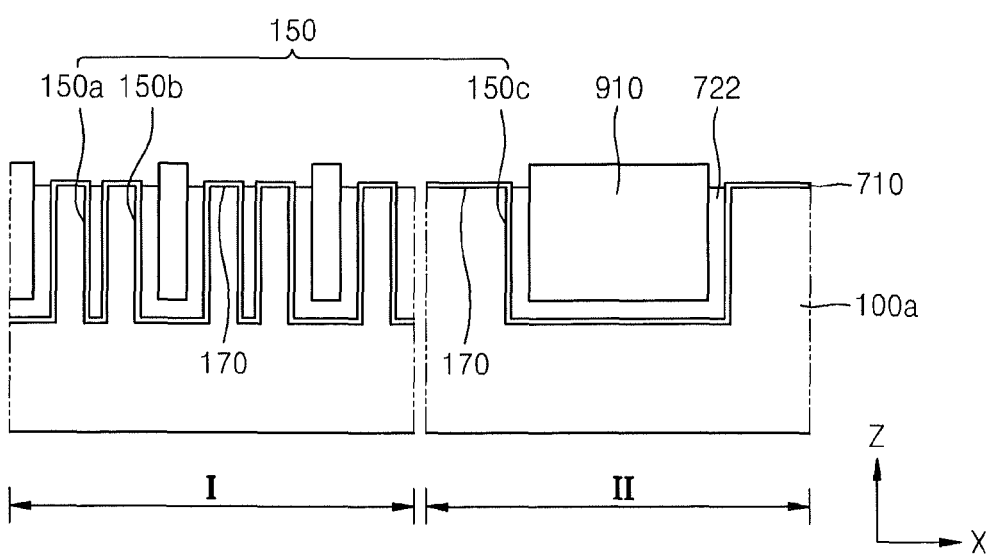

FIGS. 13A to 13C are cross-sectional views sequentially illustrating a method of fabricating a semiconductor device according to another embodiment of the inventive concept. In the current embodiment, first, the operations described above with reference to FIGS. 1 through 12A are performed.

Then, referring to FIG. 13A, a fourth trench oxide layer 910 is formed on an etched semiconductor substrate 100a having a first liner layer 722 formed thereon. The fourth trench oxide layer 910 may be formed to completely fill second trench spaces 150b and a third trench spaces 150c.

FIG. 13B is a cross-sectional view illustrating partial removal of the fourth trench oxide layer 910. Referring to FIG. 13B, the fourth trench oxide layer 910 is partially removed to expose the first liner layer 722. In order to expose the first liner layer 722, a planarizing process, e.g., a chemical mechanical polishing (CMP) process, may be performed using the first liner layer 722 as an etch stopper.

An increase in the integration degree of the semiconductor device results in a reduction in the widths of trenches 150. Thus, if the trenches 150 are filled with an oxide layer, there may be a void in the trenches 150. Accordingly, the first trench spaces 150a that are narrower than the second trench spaces 150b and the third trench spaces 150c from among the trenches 150 are filled with the first liner layer 722 and the second trench spaces 150b and the third trench spaces 150c are filled with the first liner layer 722 and the fourth trench oxide layer 910 so that the trenches 150 may be completely filled with the first liner layer 722 and the fourth trench oxide layer 910, thereby enhancing the electrical reliability of the semiconductor device.

FIG. 13C is a cross-sectional view illustrating partial removal of the first liner layer 722. Referring to FIG. 13C, the first liner layer 722 is partially removed in order to expose the first trench oxide layer 710. In order to expose the first trench oxide layer 710, the first liner layer 722 may be partially removed using wet etching or may be partially removed using dry etching to have high etch selectivity to the first trench oxide layer 710 and the fourth trench oxide layer 910.

The first trench oxide layer 710 may remain on the top surface of the etched semiconductor substrate 100a having the trenches 150 therein, i.e., on the surfaces of the active regions 170. The first trench oxide layer 710 may be used as a sacrificial oxide layer during a subsequent ion implantation or etching process. Accordingly, the sacrificial oxide layer may not be additionally performed.

While the inventive concept has been particularly shown and described with reference to exemplary embodiments thereof, it will be understood that various changes in form and details may be made therein without departing from the spirit and scope of the following claims.

What is claimed is:

1. A method of fabricating a semiconductor device, the method comprising:

forming a buffer oxide layer in a first region and a second region of a semiconductor substrate;

forming a plurality of first preliminary mask patterns on the buffer oxide layer in the first region, the plurality of first preliminary mask patterns being arranged according to a first pitch in a first direction;

forming a plurality of second preliminary mask patterns between every two adjacent first preliminary mask patterns from among the plurality of first preliminary mask patterns, respectively, the plurality of first preliminary mask patterns and the plurality of second preliminary mask patterns being spaced apart by a first space from one another;

forming a plurality of first mask patterns and a plurality of second mask patterns by trimming the plurality of first preliminary mask patterns and the plurality of second preliminary mask patterns, where the plurality of first mask patterns are spaced apart by a second space from one another and the plurality of second mask patterns are spaced apart by the second space from one another;

forming a plurality of first active region mask patterns for exposing the semiconductor substrate by etching the buffer oxide layer by using the plurality of first mask patterns and the plurality of second mask patterns as an etch mask;

defining a plurality of active regions in the semiconductor substrate by forming a trench including a plurality of first trench spaces having a same width as the first space and a plurality of second trench spaces under the second space in the first region by using the plurality of first active region mask patterns as an etch mask, where the plurality of active regions are arranged according to a half pitch of the first pitch in the first direction, and wherein the plurality of second trench spaces are wider than the plurality of first trench spaces; and forming a first liner layer on the semiconductor substrate having the trench therein such that the plurality of first trench spaces are completely filled with the first liner layer.

2. The method of claim 1, wherein the forming of the plurality of second preliminary mask patterns comprises:

forming a buffer layer having a first recessed upper surface on the plurality of first preliminary mask patterns and between every two adjacent first preliminary mask patterns from among the plurality of first preliminary mask patterns; and forming the plurality of second preliminary mask patterns on the first recessed upper surface of the buffer layer, where upper surfaces of the plurality of second preliminary mask patterns are level with upper surfaces of the plurality of second preliminary mask patterns, wherein, before forming the plurality of first mask patterns and the plurality of second mask patterns, the buffer layer is partially removed to expose the upper surfaces of the plurality of first preliminary mask patterns, and wherein the plurality of first preliminary mask patterns and the plurality of second preliminary mask patterns are formed to have a width that is one quarter of the first pitch.

3. The method of claim 2, further comprising, after forming the plurality of first preliminary mask patterns and before forming the buffer layer, forming a plurality of lower surface portions of the buffer oxide layer by removing an upper part of the buffer oxide layer exposed between the plurality of first preliminary mask patterns by a first thickness, wherein the buffer layer is formed to the first thickness and evenly covers the plurality of first preliminary mask patterns and the plurality of lower surface portions.

4. The method of claim 3, wherein the trench further comprises a third trench space, a plurality of third mask patterns are formed together with the plurality of first mask patterns and the plurality of second mask patterns formed on the buffer oxide layer in the second region, where the plurality of third mask patterns are arranged having a pitch greater than the first pitch, while the plurality of first active region mask patterns are formed, a plurality of second active region mask patterns are formed in the second region by using the plurality of third mask patterns as an etch mask, and while the plurality of first trench spaces and the plurality of second trench spaces are formed, the third trench space is formed in the second region wider than the first and second trench spaces by using the plurality of second active region mask patterns as an etch mask.

5. The method of claim 4, further comprising forming a first trench oxide layer between the semiconductor substrate having the trench therein and the first liner layer.

6. The method of claim 5, wherein, during the forming of the first liner layer, the first liner layer is formed to cover surfaces of the third trench space without filling a third recessed part of the third trench space, the method further comprising partially removing the first liner layer and the first trench oxide layer, such that the first liner layer and the first trench oxide layer remain in the plurality of first trench spaces, a top surface of the semiconductor substrate having the trench is exposed, and the semiconductor substrate is exposed via the third trench space.

7. The method of claim 6, wherein, after the first liner layer and the first trench oxide layer are partially removed, a second trench oxide layer and a third trench oxide layer are formed to completely fill the third trench space.

8. The method of claim 7, wherein, during the foaming of the first liner layer, the first liner layer is formed to cover surfaces of the plurality of second trench spaces without filling second recessed parts of the plurality of second trench spaces, when the first liner layer and the first trench oxide layer are partially removed, the semiconductor substrate is exposed via the plurality of second trench spaces, and when the second trench oxide layer and the third trench oxide layer are formed, the plurality of second trench spaces are completely filled with the second and third trench oxide layers.

9. The method of claim 7, further comprising a second liner layer between the second trench oxide layer and the third trench oxide layer.

10. The method of claim 5, wherein, during the forming of the first liner layer, the first liner layer is formed to cover surfaces of the plurality of second trench spaces and the third trench space without filling second recessed parts of the plurality of second trench spaces and a third recessed part of the third trench space, the method further comprising:

forming a fourth trench oxide layer on the first liner layer such that the plurality of second trench spaces and the third trench space are completely filled with the fourth trench oxide layer; and partially removing the first liner layer to partially expose the first trench oxide layer on a top surface of the semiconductor substrate having the trench therein.

* * * * *